(12) United States Patent
Shen et al.

(10) Patent No.: US 10,418,251 B2
(45) Date of Patent: Sep. 17, 2019

(54) METHOD OF FORMING FIN-SHAPED STRUCTURE HAVING LADDER-SHAPED CROSS-SECTIONAL PROFILE

(71) Applicant: UNITED MICROELECTRONICS CORP., Hsin-Chu (TW)

(72) Inventors: Wen-Jiun Shen, Yunlin County (TW); Ssu-I Fu, Kaohsiung (TW); Yen-Liang Wu, Taipei (TW); Chia-Jong Liu, Ping-Tung County (TW); Yu-Hsiang Hung, Tainan (TW); Chung-Fu Chang, Tainan (TW); Man-Ling Lu, Taoyuan (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/688,885

(22) Filed: Aug. 29, 2017

(65) Prior Publication Data
US 2017/0358455 A1    Dec. 14, 2017

Related U.S. Application Data

(62) Division of application No. 14/512,475, filed on Oct. 13, 2014, now Pat. No. 9,786,510.

(30) Foreign Application Priority Data

Sep. 9, 2014    (CN) .......................... 2014 1 0454915

(51) Int. Cl.
*H01L 21/8232* (2006.01)
*H01L 21/308* (2006.01)
(Continued)

(52) U.S. Cl.
CPC ...... *H01L 21/308* (2013.01); *H01L 21/30604* (2013.01); *H01L 21/823431* (2013.01);
(Continued)

(58) Field of Classification Search
CPC ............ H01L 21/308; H01L 21/30604; H01L 21/823431; H01L 21/823821; H01L 21/845; H01L 27/0886; H01L 27/0924
See application file for complete search history.

(56) References Cited

U.S. PATENT DOCUMENTS

| 8,373,238 B2 | 2/2013 | Lee |
| 8,669,167 B1 | 3/2014 | Chang |

(Continued)

FOREIGN PATENT DOCUMENTS

| CN | 101675513 A | 3/2010 |
| CN | 102214579 A | 10/2011 |

(Continued)

*Primary Examiner* — Daniel Whalen
*Assistant Examiner* — Suberr L Chi
(74) *Attorney, Agent, or Firm* — Winston Hsu (57) ABSTRACT

A fin-shaped structure includes a substrate having a first fin-shaped structure located in a first area and a second fin-shaped structure located in a second area, wherein the second fin-shaped structure includes a ladder-shaped cross-sectional profile part. The present invention also provides two methods of forming this fin-shaped structure. In one case, a substrate having a first fin-shaped structure and a second fin-shaped structure is provided. A treatment process is performed to modify an external surface of the top of the second fin-shaped structure, thereby forming a modified part. A removing process is performed to remove the modified part through a high removing selectivity to the first fin-shaped structure and the second fin-shaped structure, and the modified part, thereby the second fin-shaped structure having a ladder-shaped cross-sectional profile part is formed.

5 Claims, 5 Drawing Sheets

(51) Int. Cl.
*H01L 27/088* (2006.01)
*H01L 21/8234* (2006.01)
*H01L 21/306* (2006.01)
*H01L 29/66* (2006.01)
*H01L 21/02* (2006.01)

(52) U.S. Cl.
CPC .... *H01L 27/0886* (2013.01); *H01L 29/66818* (2013.01); *H01L 21/02238* (2013.01)

(56) References Cited

U.S. PATENT DOCUMENTS

| | | |
|---|---|---|
| 8,669,615 B1 | 3/2014 | Chang |
| 2008/0157225 A1 | 7/2008 | Datta |
| 2010/0148234 A1 | 6/2010 | Torek |
| 2012/0313169 A1 | 12/2012 | Wahl |
| 2013/0149826 A1 | 6/2013 | Lee |
| 2014/0065802 A1 | 3/2014 | Chang |
| 2014/0191323 A1 | 7/2014 | Bergendahl |
| 2014/0335673 A1 | 11/2014 | Kim |
| 2015/0145048 A1 | 5/2015 | Cheng |
| 2015/0145068 A1* | 5/2015 | Chen ............... H01L 29/785 257/401 |
| 2015/0206954 A1* | 7/2015 | Lin ............... H01L 29/66795 257/365 |
| 2015/0214365 A1* | 7/2015 | Xie ............... H01L 29/7842 257/369 |
| 2015/0311085 A1 | 10/2015 | Kozarsky |
| 2015/0340381 A1* | 11/2015 | Ramachandran ... H01L 27/1211 257/351 |
| 2016/0013184 A1* | 1/2016 | Alptekin ............ H01L 27/0886 257/401 |

FOREIGN PATENT DOCUMENTS

| | | |
|---|---|---|
| CN | 102956702 A | 3/2013 |
| CN | 103050533 A | 4/2013 |
| CN | 103107196 A | 5/2013 |
| CN | 104022116 A | 9/2014 |

\* cited by examiner

METHOD OF FORMING FIN-SHAPED STRUCTURE HAVING LADDER-SHAPED CROSS-SECTIONAL PROFILE

CROSS REFERENCE TO RELATED APPLICATIONS

This application is a divisional application of and claims the benefit of U.S. patent application Ser. No. 14/512,475, filed Oct. 13, 2014.

BACKGROUND OF THE INVENTION

1. Field of the Invention

The present invention relates generally to a fin-shaped structure and method thereof, and more specifically to a fin-shaped structure which has a ladder-shaped cross-sectional profile, and a method thereof.

2. Description of the Prior Art

With increasing miniaturization of semiconductor devices, various multi-gate MOSFET devices have been developed. The multi-gate MOSFET is advantageous for the following reasons. Manufacturing processes of multi-gate MOSFET devices can be integrated into traditional logic device processes, and thus are more compatible. In addition, since the three-dimensional structure of the multi-gate MOSFET increases the overlapping area between the gate and the substrate, the channel region is controlled more effectively, which reduces drain-induced barrier lowering (DIBL) effect and short channel effect. Moreover, the channel region is longer for the same gate length, so the current between the source and the drain is increased.

Since transistors in different areas such as logic areas and input/output areas have different purposes, structures of these transistors should be tailored to suit their particular purposes. When forming the structures, electrical demands in each area should be considered.

SUMMARY OF THE INVENTION

The present invention provides a fin-shaped structure and method thereof, which selectively forms fin-shaped structures having ladder-shaped cross-sectional profile parts in some areas, so that fin-shaped structures of different heights and critical dimensions (CD) can be formed, in order to form transistors for each area that meet each area's specific electrical demands.

The present invention provides a fin-shaped structure including a substrate having a first fin-shaped structure located in a first area and a second fin-shaped structure located in a second area, wherein the second fin-shaped structure includes a ladder-shaped cross-sectional profile part.

The present invention provides a method of forming a fin-shaped structure including the following steps. A substrate having a first fin-shaped structure located in a first area and a second fin-shaped structure located in a second area is provided. An isolation structure is filled beside the first fin-shaped structure of the first area and beside the second fin-shaped structure of the second area. A patterned mask is formed to cover the first area and expose the second area. A top part of the isolation structure of the second area is removed, to expose a first top part of the second fin-shaped structure. A treatment process is performed to modify an external surface of the first top part of the second fin-shaped structure, to form a modified part covering the first top part of the second fin-shaped structure. The patterned mask is removed. A removing process is performed to remove a part of the isolation structure and the modified part by the high removing selectivity to the first fin-shaped structure and the second fin-shaped structure, and the modified part and the isolation structure, to expose a top part of the first fin-shaped structure and a second top part of the second fin-shaped structure.

The present invention provides a method of forming a fin-shaped structure including the following steps. A substrate having a first fin-shaped structure located in a first area and a second fin-shaped structure located in a second area is provided. A first gate across the first fin-shaped structure and a second gate across the second fin-shaped structure are formed, wherein the first gate sequentially includes a first dielectric layer and a first sacrificial gate covering the first fin-shaped structure, and the second gate sequentially includes a second dielectric layer and a second sacrificial gate covering the second fin-shaped structure. The first sacrificial gate and the second sacrificial gate are removed, thereby exposing the first dielectric layer and the second dielectric layer. A mask covers the first area and exposes the second area. A removing process is performed to remove an external surface of a top part of the second fin-shaped structure. The mask is then removed.

According to the above, the present invention provides a fin-shaped structure and method thereof, which covers a mask in a first area, and then removes an external surface of a top part of a second fin-shaped structure of a second area, so that the second fin-shaped structure having a ladder-shaped cross-sectional profile in the second area is formed. Hence, fin-shaped structures of different heights and critical dimensions can be formed, and thus transistors for each area can achieve required electrical requirements. The methods of removing the external surface of the top part of the second fin-shaped structure in the second area may include: a removing process is performed to directly remove the external surface of the top part of the second fin-shaped structure; or, a treatment process may be performed to modify the external surface of the top part of the second fin-shaped structure, and a removing process may be performed to remove the modified part.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
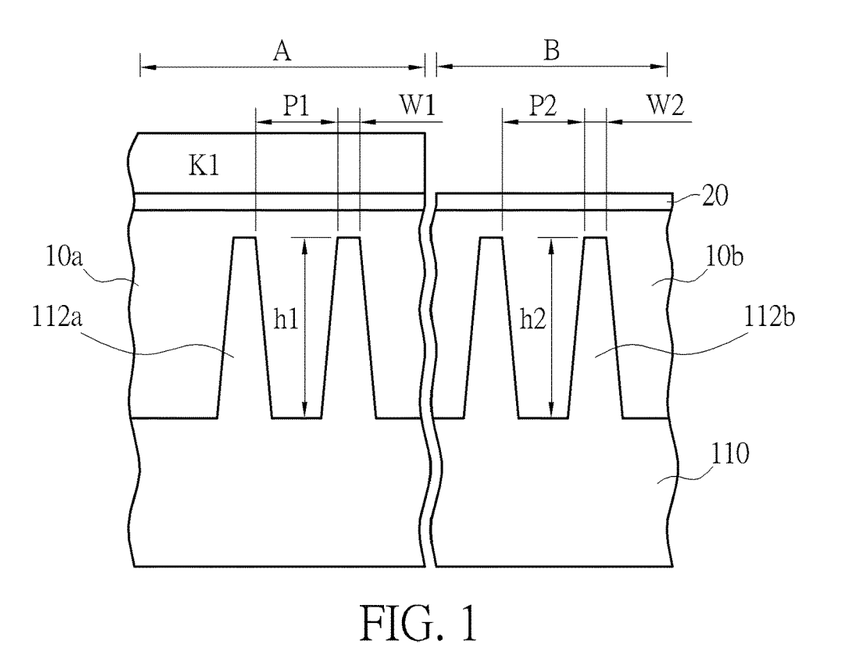
FIGS. 1-5 schematically depict a cross-sectional view of a method of forming a fin-shaped structure according to a first embodiment of the present invention.

FIGS. 1-5 schematically depict a cross-sectional view of a method of forming a fin-shaped structure according to a first embodiment of the present invention. As shown in FIG. 1, a substrate 110 is provided. The substrate 110 can be divided into a first area A and a second area B. In this embodiment, the first area A is a high voltage threshold (HVT) area while the second area B is a low voltage threshold (LVT) area, but this is not limited thereto. The first area A may be an input/output high voltage area while the second area B may be a logic area. For illustrating the present invention clearly, there are only two areas depicted in this embodiment, but the present invention can also be applied to three or more areas at the same time, depending upon practical requirements.

The substrate 110 has two first fin-shaped structures 112a in the first area A and two second fin-shaped structures 112b in the second area B. In this embodiment, two first fin-shaped structures 112a are formed in the first area A and two second fin-shaped structures 112b are formed in the second area B, but the number of the first fin-shaped structures 112a or the second fin-shaped structures 112b is not restricted thereto. In this embodiment, the first fin-shaped structures 112a and the second fin-shaped structures 112b have the same structure. A height h1 of each of the first fin-shaped structures 112a is common to a height h2 of each of the second fin-shaped structures 112b; a width w1 of a top part of each of the first fin-shaped structures 112a is the same as a width w2 of a top part of each of second fin-shaped structures 112b; and a first distance p1 between a top part of each of the first fin-shaped structures 112a is the same as a distance p2 between a top part of each of the second fin-shaped structures 112b. Therefore, when a selective treatment process is performed on one single area or on a plurality of areas, symmetric structures in these areas will receive the same influence and uniform structures can be formed. The first distance p1 between a top part of each of the first fin-shaped structures 112a may also be different from the distance p2 between a top part of each of the second fin-shaped structures 112b.

More precisely, the method of forming the first fin-shaped structures 112a in the first area A and forming the second fin-shaped structures 112b in the second area B may include, but is not limited to, the following steps. A bulk bottom substrate (not shown) is provided. A hard mask layer (not shown) may be formed on the bulk bottom substrate (not shown) and is patterned to define the location of the first fin-shaped structures 112a and the second fin-shaped structures 112b in the bulk bottom substrate (not shown) by a sidewall image transfer process. An etching process is performed to form the first fin-shaped structures 112a and the second fin-shaped structures 112b. The first fin-shaped structures 112a and the second fin-shaped structures 112b located in the substrate 110 are then formed completely. In one embodiment, the hard mask layer (not shown) is removed after the first fin-shaped structures 112a and the second fin-shaped structures 112b are formed, and a tri-gate MOSFET can be formed in the following processes. There are three contact faces between the first fin-shaped structures 112a and the second fin-shaped structures 112b and the following formed dielectric layer functions as a carrier channel whose width is wider than a channel width in a conventional planar MOSFET. When a driving voltage is applied, the tri-gate MOSFET produces a double on-current compared to the conventional planar MOSFET. In another embodiment, the hard mask layer (not shown) is reserved to form a fin field effect transistor (Fin FET), which is another kind of multi-gate MOSFET. Due to the hard mask layer (not shown) being reserved in the fin field effect transistor, there are only two contact faces between the first fin-shaped structures 112a and the second fin-shaped structures 112b and the following formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed.

Isolation structures 10a and 10b are filled beside the first fin-shaped structures 112a in the first area A and beside the second fin-shaped structures 112b in the second area B. The isolation structures 10a and 10b may be shallow trench isolation (STI) structures, and may include oxide, but are not limited thereto. In this embodiment, the isolation structures 10a and 10b are filled beside the first fin-shaped structures 112a in the first area A and beside the second fin-shaped structures 112b in the second area B simultaneously, and the isolation structures 10a and 10b have the same height. Therefore, symmetric structures are formed in the first area A and the second area B. As a selective treatment process is performed on one single area or on a plurality of areas, symmetric structures in these areas can receive the same influence and thus uniform structures can be formed. In another embodiment, the isolation structures 10a and 10b may have different heights and may be formed by different processes, depending upon practical requirements.

After the first fin-shaped structures 112a and the second fin-shaped structures 112b are formed, a doping process may be selectively performed to form wells in the first area A and the second area B or to change threshold voltages in the two areas.

Figure 2:
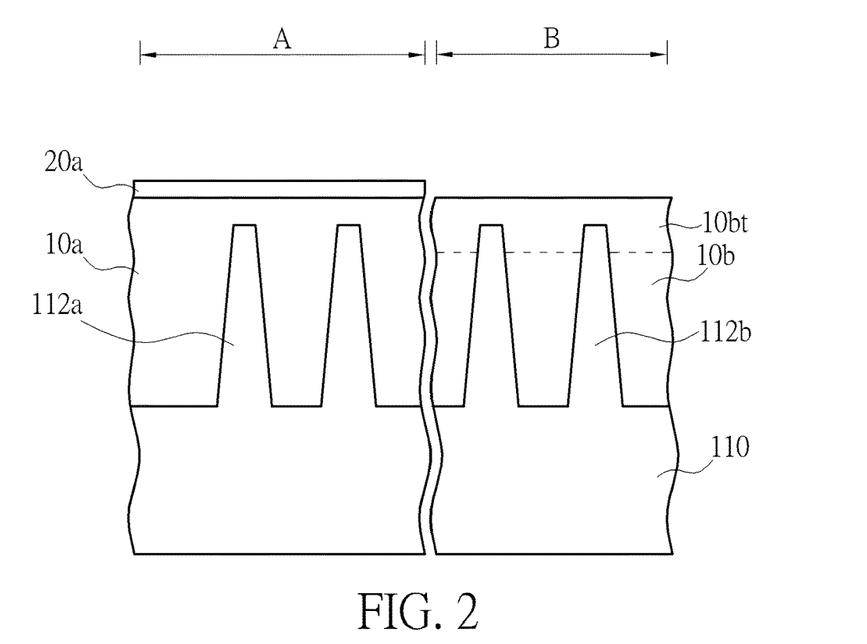

A patterned mask 20a is then formed to cover the first area A but expose the second area B. As shown in FIG. 1, a mask 20 blanket-covers the first area A and the second area B. A photoresist (not shown) is deposited and patterned to form a patterned photoresist K1 on the mask 20, wherein the patterned photoresist K1 covers the first area A but exposes the second area B. Thereafter, an etching process is performed to remove the exposed mask 20 in the second area B, so a patterned mask 20a is formed only in the first area A. Then, the patterned photoresist K1 is removed, as shown in FIG. 2. In this embodiment, the patterned mask 20a is a silicon nitride layer, but it is not limited thereto.

Figure 3:
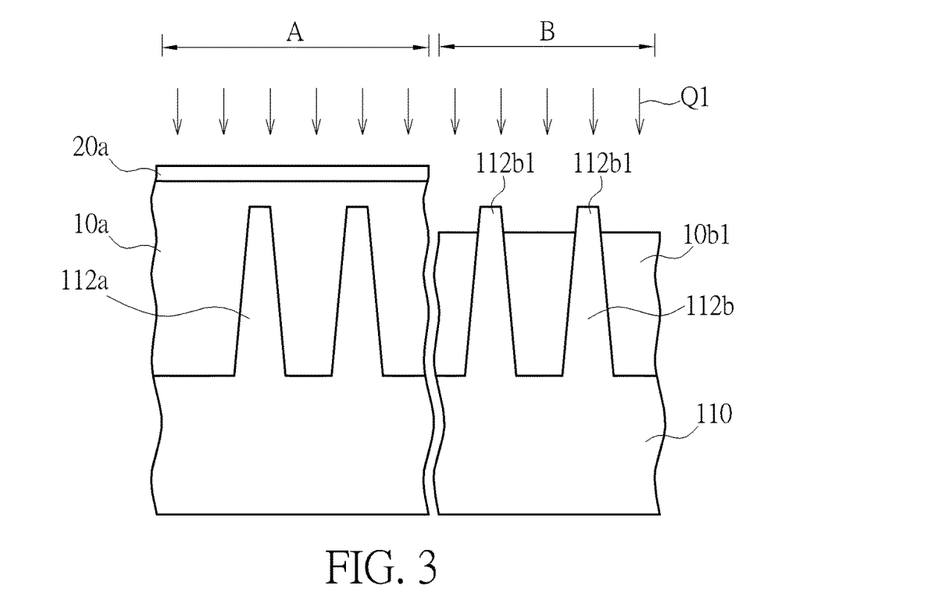

A removing process Q1 may be performed to remove a top part 10bt of the isolation structure 10b in the second area B, to form an isolation structure 10b1 and expose first top parts 112b1 of the second fin-shaped structures 112b, as shown in FIG. 3. It is emphasized that, due to the patterned mask 20a blanket-covering the first area A, the isolation structure 10a and the first fin-shaped structures 112a are reserved completely without being removed. In this embodiment, the removing process Q1 may be an ammonia and nitrogen trifluoride containing etching process, which has a high etching selectivity to the isolation structure 10b and the second fin-shaped structures 112b; that is, the etching rate of the removing process Q1 to the isolation structure 10b is much larger than to the second fin-shaped structures 112b, so only the isolation structure 10b is removed without removing the second fin-shaped structures 112b. In another embodiment, the removing process Q1 may be other processes, but these processes must have high removing selectivity to the isolation structure 10b and the second fin-shaped structures 112b in order to remove a part of the isolation structure 10b and expose a part of the second fin-shaped structures 112b.

Figure 4:
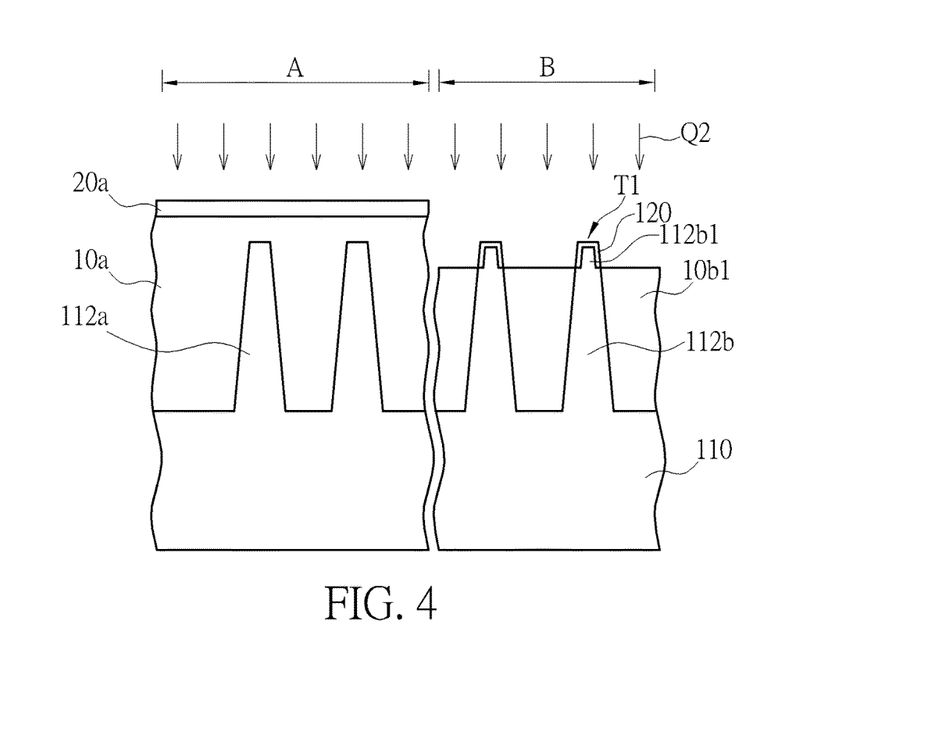

As shown in FIG. 4, a treatment process Q2 is performed to modify an external surface T1 of a first top part 112b1 of each of the second fin-shaped structures 112b, thereby a modified part 120 covering the first top part 112b1 of each of the second fin-shaped structures 112b is formed. In this embodiment, due to the isolation structures 10a and 10b being composed of oxide, the modified parts 120 are preferably composed of oxide, for being removed together with the isolation structures 10a and 10b in later processes. The treatment process Q2 is preferably an oxidation process, which may be an oxygen gas-containing process or an in situ steam generation (ISSG) process.

Figure 5:
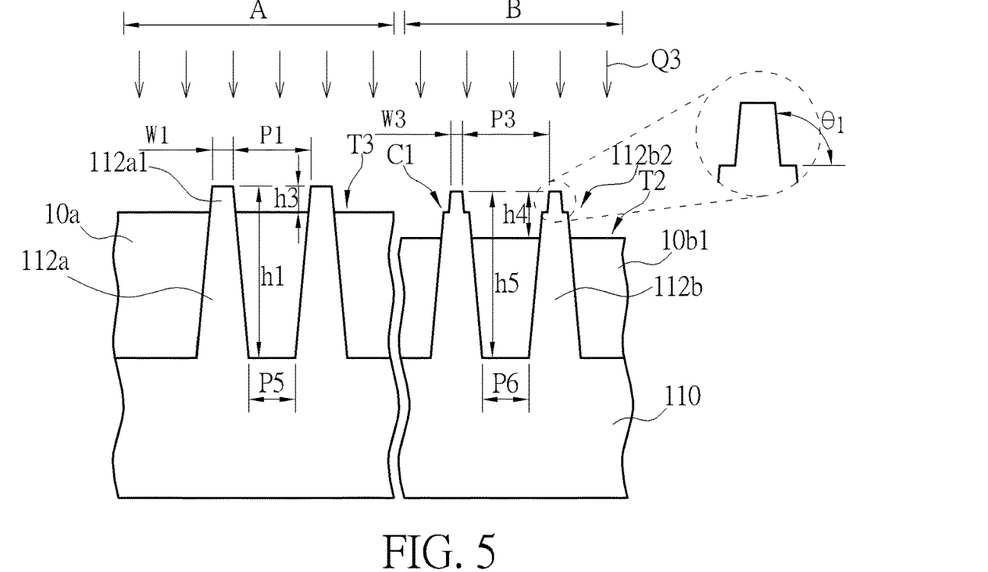

After the modified parts 120 are formed, the patterned mask 20a is removed, as shown in FIG. 5. Thereafter, a removing process Q3 is performed to remove the modified parts 120 and a part of the isolation structures 10a and 10b1 simultaneously, to form a top part 112a1 of each of the first fin-shaped structures 112a and a second top part 112b2 of each of the second fin-shaped structures 112b. In this embodiment, the modified parts 120 and the part of the isolation structures 10a and 10b1 are removed simultaneously without removing the first fin-shaped structures 112a and the second fin-shaped structures 112b by the high removing selectivity of the removing process Q3 to the first fin-shaped structures 112a and the second fin-shaped structures 112b, and the modified part 120 and the isolation structures 10a and 10b1.

Each of the second fin-shaped structures 112b having a ladder-shaped cross-sectional profile part C1 can be formed while reserving the original first fin-shaped structures 112a. The ladder-shaped cross-sectional profile part C1 has a bending angle θ1, which is preferably larger than or equal to 90°. It is emphasized that a specific following structure is formed by applying the method of forming a fin-shaped structure of the present invention. The width w1 of the top part of each of the first fin-shaped structures 112a comprising a first fin and a second fin is larger than a width w3 of a top part of each of the second fin-shaped structures 112b comprising a third fin and a fourth fin. The first distance p1 between adjacent top corners of the first fin and the second fin of the first fin-shaped structures 112a is less than a second distance p3 between adjacent top corners of the third fin and the fourth fin of the second fin-shaped structures 112b while a third distance p5 between adjacent lower parts of the first fin and the second fin is the same as a fourth distance p6 between adjacent lower parts of the third fin and the fourth fin. The ladder-shaped cross-sectional profile part C1 of each of the second fin-shaped structures 112b is higher than a top surface T2 of the isolation structure 10b1. A top surface T3 of the isolation structure 10a in the first area A is higher than the top surface T2 of the isolation structure 10b1 in the second area B. A height h3 of each of the first fin-shaped structures 112a protruding from the isolation structure 10a is lower than a height h4 of each of the second fin-shaped structures 112b protruding from the isolation structure 10b1. The height h1 of each of the first fin-shaped structures 112a protruding from the substrate 110 is higher than a height h5 of each of the second fin-shaped structures 112b protruding from the substrate 110.

Thereafter, processes such as forming gates or transistors may be performed. For instance, a gate may be formed across the first fin-shaped structures 112a of the first area A and the second fin-shaped structures 112b of the second area B respectively; a source/drain may be formed in the first fin-shaped structures 112a and the second fin-shaped structures 112b beside the gates respectively; and an interdielectric layer may be formed to cover the gates, the first fin-shaped structures 112a and the second fin-shaped structures 112b.

The first fin-shaped structures 112a and the second fin-shaped structures 112b having ladder-shaped cross-sectional profile parts C1 are formed and then the gates are formed on the first fin-shaped structures 112a and the second fin-shaped structures 112b, thereby the whole second fin-shaped structures 112b of the second area B have a ladder-shaped cross-sectional profile parts C1 in the first embodiment.

A second embodiment is presented in the following. Common first fin-shaped structures and second fin-shaped structures are formed firstly and gates are formed across the first fin-shaped structures and the second fin-shaped structures, and then parts of the first fin-shaped structures and the second fin-shaped structures are exposed to form the second fin-shaped structures having ladder-shaped cross-sectional profile parts by applying the present invention. In this way, only the parts of the second fin-shaped structure right below the gates have the ladder-shaped cross-sectional profile parts.

Figure 6:
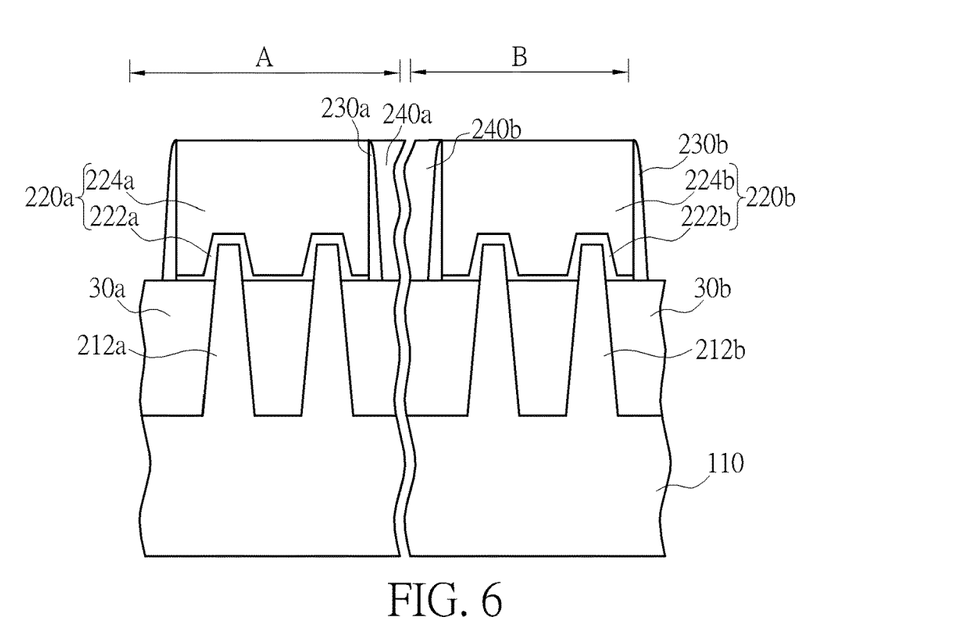
FIGS. 6-10 schematically depict a cross-sectional view of a method of forming a fin-shaped structure according to a second embodiment of the present invention.

FIGS. 6-10 schematically depict a cross-sectional view of a method of forming a fin-shaped structure according to a second embodiment of the present invention. As shown in FIG. 6, a substrate 110 is provided. The substrate 110 can be divided into a first area A and a second area B. In this embodiment, two first fin-shaped structures 212a are formed in the first area A and two second fin-shaped structures 212b are formed in the second area B, but the number of the first fin-shaped structures 212a or the second fin-shaped structures 212b is not restricted thereto. As in the first embodiment, the first fin-shaped structures 212a and the second fin-shaped structures 212b are common structures. Therefore, symmetric structures are formed in the first area A and the second area B. When a selective treatment process performed on one single area or on a plurality of areas, symmetric structures in these areas can receive the same influence and thus uniform structures can be formed. The methods of forming the first fin-shaped structures 212a and the second fin-shaped structures 212b which are common to those of the first embodiment are not described herein.

Isolation structures 30a and 30b are filled beside the first fin-shaped structures 212a in the first area A and beside the second fin-shaped structures 212b in the second area B respectively. The isolation structures 30a and 30b may be shallow trench isolation (STI) structures, and may include oxide. In this embodiment, the isolation structures 10a and 10b are filled beside the first fin-shaped structures 212a in the first area A and beside the second fin-shaped structures 212b in the second area B simultaneously, therefore the isolation structures 30a and 30b will have the same height. Symmetric structures are formed in the first area A and the second area B. When a selective treatment process is performed on one single area or on a plurality of areas, symmetric structures in these areas can receive the same influence and thus uniform structures can be formed. In another embodiment, the isolation structures 30a and 30b may have different heights and may be formed by different processes, depending upon practical requirements. Moreover, after the first fin-shaped structures 212a and the second fin-shaped structures 212b are formed, a doping process may be selectively performed to form wells in the first area A and the second area B respectively or to change threshold voltages in the two areas.

A first gate 220a is formed across the first fin-shaped structures 212a of the first area A and a second gate 220b is formed across the second fin-shaped structures 212b of the second area B. More precisely, the first gate 220a may include a first dielectric layer 222a and a first sacrificial gate 224a from bottom to top to cover the first fin-shaped structures 212a, and the second gate 220b may include a second dielectric layer 222b and a second sacrificial gate 224b from bottom to top to cover the second fin-shaped structures 220b. Spacers 230a and 230b may be formed on the isolation structures 30a and 30b beside the first gate 220a and the second gate 220b respectively. Interdielectric layers 240a and 240b may be formed to blanket the substrate 110 beside the first gate 220a and the second gate 220b. In this embodiment, the first dielectric layer 222a and the second dielectric layer 222b may be oxide layers, the first sacrificial gate 224a and the second sacrificial gate 224b may be polysilicon gates, the spacers 230a and 230b may be nitride spacers, and the interdielectric layers 240a and 240b may be oxide layers, but this is not limited thereto. The methods of forming the first gate 220a and the second gate 220b, the spacers 230a and 230b and the interdielectric layers 240a and 240b are known in the art, and are not described herein.

Figure 7:
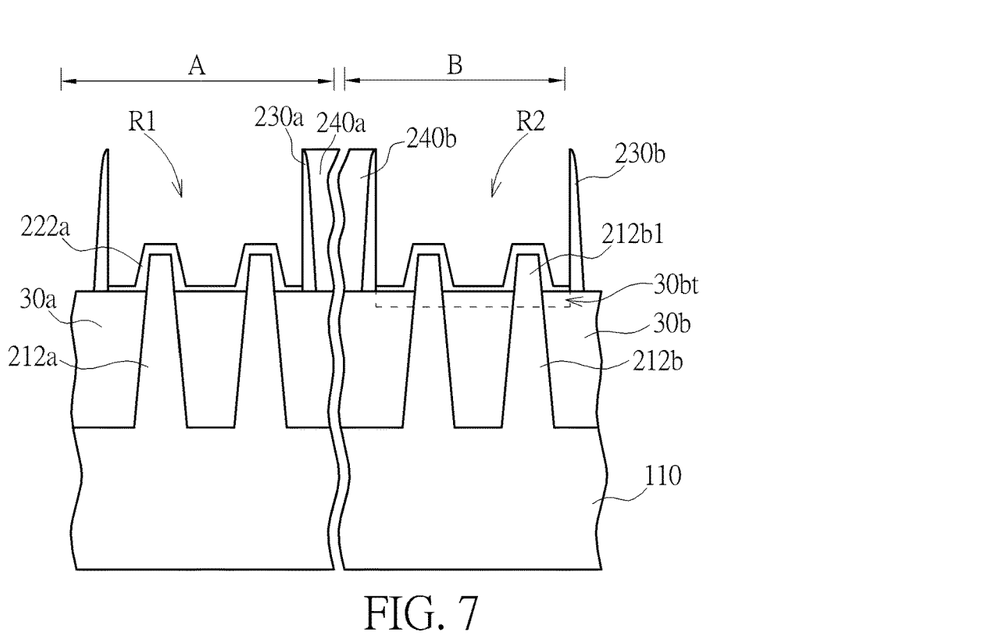

An etching process may be performed to remove the first sacrificial gate 224a and the second sacrificial gate 224b and expose the first dielectric layer 222a and the second dielectric layer 222b, to thereby form recesses R1 and R2 in the first area A and the second area B respectively, as shown in FIG. 7.

Figure 8:
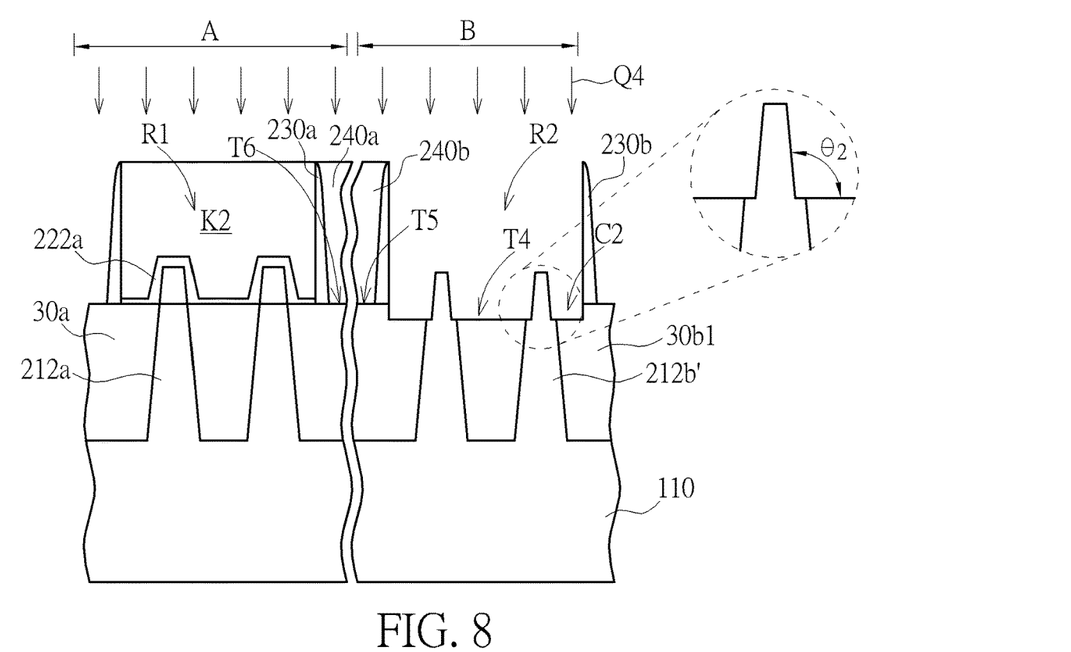

As shown in FIG. 8, a mask K2 is formed to cover only the first area A but expose the second area B. In this embodiment, the mask K2 fills the recess R1 of the first area A. FIGS. 7-8 illustrate a removing process Q4 being performed to remove an external surface S1 of a top part of each of the second fin-shaped structures 212b (as shown in FIG. 7), to form second fin-shaped structures 212b' having ladder-shaped cross-sectional profile parts C2, wherein the ladder-shaped cross-sectional profile parts C2 have a bending angle θ2, and the bending angle θ2 is preferably larger than or equal to 90°. In this embodiment, the second dielectric layer 222b and the top part 30bt of the isolation structure 30b below the second dielectric layers 222b are removed as the removing process Q4 is performed to remove the external surfaces S1 of the second fin-shaped structures 212b. An isolation structure 30b1 is formed, and a top surface T4 of the isolation structure 30b1 at the bottom of the recess R2 is lower than a top surface T5 of isolation structure 30b1 beside the recess R2, and even lower than a top surface T6 of the isolation structure 30a in the first area A, depending upon the etchants of the removing process Q4 and a desired formed structure. In another embodiment, modified parts may be formed from the top parts of the second fin-shaped structures 212b as described in the first embodiment, and then the modified parts are removed.

It is emphasized that, since the second dielectric layer 222b and the second fin-shaped structures 212b below the second dielectric layer 222b are removed by the removing process Q4, the removing process Q4 has non-removing selectivity to the second dielectric layer 222b and the second fin-shaped structures 212b. This means the removing rate of the removing process Q4 to the second dielectric layer 222b is equal to that of the second fin-shaped structures 212b. In one case, the removing process Q4 may be a fluorine containing process. Since the second dielectric layer 222b is an oxide layer and the isolation structure 30b is composed of oxide, a part of the isolation structure 30b in the recess R2 is also removed when the removing process Q4 for removing the second dielectric layer 222b is performed.

Figure 9:
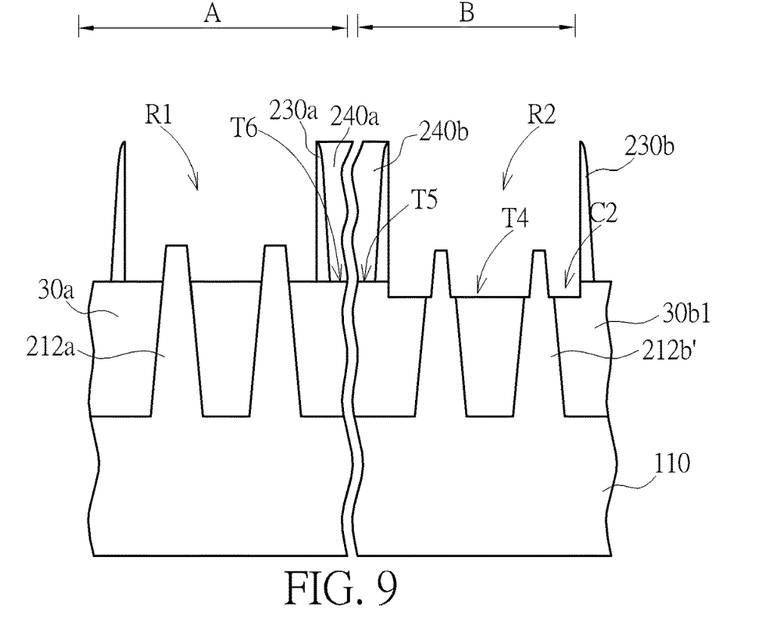
Figure 10:
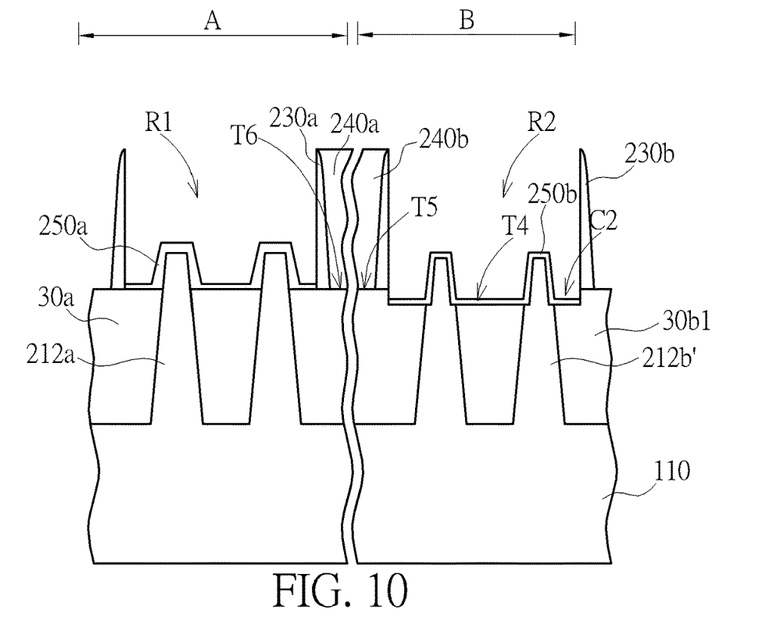

After the second fin-shaped structures 212b' having ladder-shaped cross-sectional profile parts C2 are formed, the mask K2 and the first dielectric layer 222a in the first area A are removed, as shown in FIG. 9. In this embodiment, the mask K2 may be removed by an O2 stripping process, and the first dielectric layer 222a may be removed by an ammonia and nitrogen trifluoride containing etching process, but this is not limited thereto. As shown in FIG. 10, dielectric layers 250a and 250b cover the first fin-shaped structures 212a and the second fin-shaped structures 212b' respectively. The dielectric layers 250a and 250b may be formed by the same process and have the same thickness, or may be formed by different processes or materials to have different thicknesses. For instance, the first area A is a high voltage threshold (HVT) area while the second area B is a low voltage threshold (LVT) area, so the thickness of the dielectric layer 250a of the first area A is larger than the thickness of the dielectric layer 250b of the second area B; or, the materials of the dielectric layers 250a and 250b may be different, enabling the dielectric layer 250a to have the capability of preventing high voltages while the dielectric layer 250b has lower Equivalent Oxide Thickness (EOT).

In this embodiment, the first dielectric layer 222a is removed and then the dielectric layers 250a and 250b are reformed. In other embodiments, the first dielectric layer 222a may not be removed while the dielectric layers 250a and 250b are formed directly on the first dielectric layer 222a; or, only the dielectric layer 250b in the second area B is formed. As shown in FIGS. 8-9, the mask K2 is formed, and the first dielectric layer 222a is then removed completely in this embodiment. In another embodiment, the first dielectric layer 222a and the second dielectric layer 222b may be removed before the mask K2 is formed.

To summarize, the present invention provides a fin-shaped structure and method thereof, which covers a mask in a first area, and then removes an external surface of a top part of a second fin-shaped structure of a second area, so that a part, or all, of the second fin-shaped structures in the second area having ladder-shaped cross-sectional profiles can be formed. Hence, fin-shaped structures having different heights and critical dimensions can be formed in different areas, and thus transistors for each area can achieve their electrical requirements.

The methods of removing the external surface of the top part of the second fin-shaped structure in the second area after covering the mask in the first area may include: performing a removing process to directly remove the external surface of the top part of the second fin-shaped structure, wherein the removing process has non-removing selectivity to the second fin-shaped structure and materials except for those above the second fin-shaped structure such as dielectric layers or isolation structures, to remove them. In addition, a treatment process may be performed to modify the external surface of the top part of the second fin-shaped structure in the second area, and then the removing process is performed to remove the modified part, wherein the removing process has high removing selectivity to the modified part and the original second fin-shaped structure, so that the modified part can be removed without removing the second fin-shaped structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a fin-shaped structure, comprising:
providing a substrate having a first fin-shaped structure located in a first area and a second fin-shaped structure located in a second area;
filling an isolation structure beside the first fin-shaped structure of the first area and beside the second fin-shaped structure of the second area respectively;

forming a patterned mask covering the first area but exposing the second area;

removing a top part of the isolation structure of the second area, thereby exposing a first top part of the second fin-shaped structure;

performing a treatment process to modify an external surface of the first top part of the second fin-shaped structure, thereby forming a modified part only covering the first top part of the second fin-shaped structure;

removing the patterned mask; and performing a removing process to remove a part of the isolation structure and the modified part by a high removing selectivity to the first fin-shaped structure and the second fin-shaped structure, and the modified part and the isolation structure, thereby exposing a top part of the first fin-shaped structure and a second top part of the second fin-shaped structure, wherein a height of the first top part and the second top part of the second fin-shaped structure protruding from the isolation structure is larger than a height of the top part of the first fin-shaped structure protruding from the isolation structure.

2. The method of forming a fin-shaped structure according to claim 1, wherein the isolation structure comprises oxide and the modified part comprises oxide.

3. The method of forming a fin-shaped structure according to claim 1, wherein the treatment process comprises an oxidation process.

4. The method of forming a fin-shaped structure according to claim 3, wherein the treatment process comprises an oxygen gas-containing process or an in-situ steam generated (ISSG) process.

5. The method of forming a fin-shaped structure according to claim 1, wherein the removing process comprises an ammonia and nitrogen trifluoride containing etching process.

* * * * *